United States Patent
Recchia et al.

(10) Patent No.: US 10,625,334 B2
(45) Date of Patent: Apr. 21, 2020

(54) METHOD OF PRODUCING A RELIEF IMAGE FROM A LIQUID PHOTOPOLYMER RESIN

(71) Applicant: MacDermid Graphics Solutions, LLC, Waterbury, CT (US)

(72) Inventors: David A. Recchia, Smyrna, GA (US); Ryan W. Vest, Cumming, GA (US)

(73) Assignee: MACDERMID GRAPHICS SOLUTIONS, LLC, Waterbury, CT (US)

( * ) Notice: Subject to any disclaimer, the term of this patent is extended or adjusted under 35 U.S.C. 154(b) by 335 days.

(21) Appl. No.: 15/484,314

(22) Filed: Apr. 11, 2017

(65) Prior Publication Data
US 2018/0290343 A1    Oct. 11, 2018

(51) Int. Cl.
| | | |
|---|---|---|
| *B22C 9/06* | (2006.01) | |
| *G03F 7/20* | (2006.01) | |
| *B29C 33/38* | (2006.01) | |
| *B29C 35/08* | (2006.01) | |
| *B29K 105/24* | (2006.01) | |
| *B29L 31/00* | (2006.01) | |
| *G03F 7/00* | (2006.01) | |
| *G03F 7/26* | (2006.01) | |

(52) U.S. Cl.
CPC ............ *B22C 9/06* (2013.01); *B29C 33/3842* (2013.01); *B29C 35/0894* (2013.01); *G03F 7/2012* (2013.01); *B29C 2035/0827* (2013.01); *B29C 2035/0833* (2013.01); *B29K 2105/24* (2013.01); *B29L 2031/757* (2013.01); *G03F 7/0017* (2013.01); *G03F 7/26* (2013.01)

(58) Field of Classification Search
None
See application file for complete search history.

(56) References Cited

U.S. PATENT DOCUMENTS

| | | |
|---|---|---|
| 2,760,863 A | 8/1956 | Louis Plambeck, Jr. |
| 3,794,494 A | 2/1974 | Kai |
| 3,848,998 A | 11/1974 | Yonekura et al. |
| 3,960,572 A | 6/1976 | Ibata et al. |
| 4,442,302 A | 4/1984 | Pohl |
| 4,668,607 A | 5/1987 | Wojcik |

(Continued)

FOREIGN PATENT DOCUMENTS

JP    2011/053424 A    3/2011

*Primary Examiner* — Jacob T Minskey
*Assistant Examiner* — Baileigh Kate Darnell
(74) *Attorney, Agent, or Firm* — Carmody Torrance Sandak & Hennessey LLP

(57) ABSTRACT

A method of producing a relief image or mold from a liquid photopolymer resin, said method comprising the steps of: a) placing an image film onto an exposure glass; b) placing a cover film over the image film and drawing a vacuum c) placing substrate material on a bottom glass d) casting a liquid photopolymer resin layer onto the substrate material; d) laminating a flexible polyester sheet onto a backside of the liquid photopolymer resin layer as the liquid photopolymer resin layer is being cast onto the substrate material; and e) exposing the liquid photopolymer resin layer through the image film to selectively crosslink and cure the photopolymerizable resin layer and form a cured relief image, wherein said depth of the cured relief image is less than the height of the cast liquid photopolymerizable resin.

16 Claims, 1 Drawing Sheet

(56) References Cited

U.S. PATENT DOCUMENTS

| | | | |
|---|---|---|---|
| 5,213,949 A | 5/1993 | Kojima et al. | |
| 5,753,414 A * | 5/1998 | Rach | B41N 1/14 |
| | | | 430/259 |
| 5,813,342 A | 9/1998 | Strong | |
| 8,076,054 B2 * | 12/2011 | Katayose | C09D 133/14 |
| | | | 430/281.1 |
| 8,476,000 B2 | 7/2013 | Vest et al. | |
| 2003/0111771 A1 | 6/2003 | Gybin | |
| 2008/0107908 A1 | 5/2008 | Long et al. | |
| 2011/0300398 A1 * | 12/2011 | Vest | G03F 7/0017 |
| | | | 428/600 |

* cited by examiner

METHOD OF PRODUCING A RELIEF IMAGE FROM A LIQUID PHOTOPOLYMER RESIN

FIELD OF THE INVENTION

The present invention relates generally to methods of producing a relief image from a liquid photopolymerizable resin.

BACKGROUND OF THE INVENTION

Photopolymerizable and/or photocurable and/or radiation curable resins can be selectively cross-linked and cured to create relief images during the production of relief image printing plates (including flexographic printing plates). These images are also desirable in other applications, including the production of signboards, such as plaques, display panels, decorative shields, same plates, Braille boards and the like and the combination of one or more of the foregoing. These resins can also be used making master relief patterns for the production of molds, to produce castings, including bronze and other metal castings.

A common approach currently used to make flexographic printing plates utilizes a photopolymerizable, also known as a photosensitive, photoimageable, photopolymer, photohardenable or photocurable resin composition. While many different photopolymerizable resin compositions are known, they share the quality that upon exposure to certain wavelengths of light, the resin reacts with itself to form a structure that is insoluble in ink. Thus, photopolymerizable resin compositions may be used to form a hard, ink-insoluble, raised surface (i.e., relief image) for photopolymer plates.

Photopolymerizable resins can be processed either as a solid plate made of a cast photopolymerizable resin or by forming a layer of a liquid photopolymerizable resin and exposing the formed resin layer to actinic radiation followed by developing to remove uncured portions of the photopolymerizable resin layer. Liquid photopolymerizable resins provide an advantage over solid sheet polymers because the uncured resin can be reclaimed from the non-image areas for later reuse. Liquid photopolymerizable resins have a further advantage as compared to sheet polymers in terms of flexibility to enable the production of images of widely varying thicknesses simply by changing the machine settings.

In a typical process for preparing a printing plate or other relief image, an image-bearing transparency or negative, i.e., a transparent film having opaque regions corresponding to the reverse of the image which one desires to impart to a printing plate, is placed on a glass platen, and covered with a transparent, polymeric coverfilm and a liquid photopolymerizable resin is released from a resin reservoir and is cast onto the cover film with the aid of a leveling blade. The image-bearing transparency and coverfilm are secured by vacuum to the platen so that air is displaced and bubbles are not created in the liquid photopolymerizable layer. Substantially simultaneously with casting the liquid photopolymerizable resin, a substrate, such as a polymeric film, is placed on the layer of photopolymerizable resin. A second source of actinic radiation may be positioned above the substrate. In this instance, a glass platen is positioned between the substrate and the second source of actinic radiation to provide a means for controlling thickness uniformity of the layer of photopolymerizable resin by lowering the glass platen, prior to exposure, to rest on shims and make contact with the substrate.

The liquid photopolymerizable resin is then exposed to actinic radiation to crosslink and cure the photopolymerizable resin and produce the relief image printing plate or other relief image product. The exposure can be a blanket exposure, in which the entire surface is exposed to actinic radiation (i.e., to create the floor layer) or may be an imagewise exposure in which the photopolymerizable floor layer is exposed through a film negative or other photomask.

The photopolymerizable resin is imaged by exposing the cast photopolymerizable resin to actinic radiation through the film negative or other photomask to selectively crosslink and cure the photopolymerizable resin. The image is typically exposed from at least one side of the plate, preferably the front side, and in some instances may be imaged from both the top and bottom as discussed above. Actinic light, such as UV light, is directed against the photopolymerizable resin layer through the film negative or other photomask. The result is that the liquid photopolymerizable resin is selectively cross-linked and cured to form a printing image surface that mirrors the image on the negative. Upon exposure to actinic radiation, the liquid photopolymerizable resin polymerizes and changes from a liquid state to a solid state to form the raised relief image.

The regions of the resin layer which were protected from the actinic radiation by the opaque regions of the transparency are washed away using a developer solution. The cured regions are insoluble in the developer solution, and so after development a relief image formed of cured photopolymerizable resin is obtained. The cured resin is likewise insoluble in certain inks, and thus may be used in flexographic printing as described above. U.S. Pat. No. 2,760,863 to Plambeck describes another typical process for preparing a printing plate using photopolymerizable resin. A variation on the above-described process is to expose a liquid photopolymerizable resin to actinic radiation from two sides of the resin layer. See, for example, U.S. Pat. No. 3,848,998 to Yonekura et al.

In all areas not exposed to UV radiation, the photopolymerizable resin remains liquid after exposure and can then be recovered and reclaimed. In a typical process, the uncured photopolymerizable resin is physically removed from the plate in a further process step such that it can be reused to make further plates. Any residual traces of liquid photopolymerizable resin remaining are then removed by nozzle washing or brush washing using a wash-out solution to obtain a washed-out plate, leaving behind the cured relief image. This reclamation technique not only saves material costs of the photopolymerizable resin but also reduces the use and cost of developing chemistry and makes a lighter relief image plate that is safer and easier to handle.

Residual traces of liquid photopolymerizable resin remaining in the regions of the photopolymerizable resin which were protected from the actinic radiation by the opaque regions of the image or film negative can then be washed away using a developer solution or by other development means as is known in the art. The cured regions are insoluble in the developer solution. Thereafter, the cured printing plate may be subjected to various post exposure steps. For example, the plate may be completely immersed in water and exposed to actinic radiation such as UV light emitted from a light source to perform a complete curing of the entire plate and to increase plate strength. After development, a relief image formed of cured photopolymerizable resin is obtained.

Liquid platemaking processes are also described, for example in U.S. Pat. No. 5,213,949 to Kojima et al., U.S. Pat. No. 5,813,342 to Strong et al. and U.S. Patent Publication No. 2008/0107908 to Long et al., the subject matter of each of which is herein incorporated by reference in its entirety.

U.S. Patent Publication No. 2003/0111771 to Gybin et al., the subject matter of which is herein incorporated by reference in its entirety, describes a mold making process for making cast objects. Gybin describes a method of forming a mold that can be used for making customized molded objects or making low-volume molded components. A photosensitive film laminate, including at least one layer of photosensitive material, is selectively exposed to actinic radiation and a portion that corresponds to either the exposed or unexposed portion of the photosensitive material is removed. Removal of this portion forms a relief surface in the laminate film and a casting material can then be applied to relief surface to form a cast article. Suitable casting materials include, but are not limited to plaster, resins, and low melting temperature metal alloys.

U.S. Pat. No. 4,668,607 to Wojcik, the subject matter of which is herein incorporated by reference in its entirety, describes another process for using photosensitive resins in the production of casting molds, particularly for use with cast metal, including bronze which includes forming a master mold and then a female mold from the master mold. In the fabrication of bronze castings, including for example, decorative or commemorative plaques and the like, a female mold is usually prepared into which bronze or other metal is poured.

The typical method of imagewise exposing and developing liquid photopolymerizable resins produces relief images in which the relief comprises a raised pattern of cured photopolymer, and the raised pattern comprises essentially flat top surfaces of the raised pattern and sharp edges at the point where the top surface of the raised pattern meets the sidewall of the raised pattern. This is typical of curing against a flat surface or under impression by a flat surface as is done in liquid photocuring and produces a desirable result, especially for relief image printing in which a substantially planar printing surface is necessary to produce a good result.

In other applications however, rounded/smooth image edges would be preferable and desirable, such that there is not as sharp edge at the point where the top surface of the raised pattern meets the sidewall of the raised pattern. Rounded/smooth image edges are often desired, for example, in signage applications, bronze casting and molding applications, and applications which involve the formation of Braille dots.

Thus, it would be desirable to provide a method of curing liquid photopolymerizable resins to produce a relief image having rounded and/or smooth edges.

SUMMARY OF THE INVENTION

It is an object of the present invention to provide a method of processing liquid photopolymerizable resins to produce a relief image therein.

It is another object of the present invention to provide an improved method of curing such liquid photopolymerizable resins to produce a relief image having desirable characteristics.

It is another object of the present invention to provide an improved method of curing such liquid photopolymerizable resins to produce a relief image having rounded and/or smooth edges.

It is still another object of the present invention to provide an improved method of processing liquid photopolymerizable resins in the production of casting molds.

To that end, the present invention relates to a method of producing a relief image or mold from a liquid photopolymer resin, said method comprising the steps of:
  a) placing an image film onto an exposure glass of an exposure unit;
  b) placing a coverfilm onto the image film and applying a vacuum between the coverfilm and the exposure glass to tightly pull the coverfilm and the image film onto the exposure glass;
  c) placing a sheet of substrate material onto a bottom glass of the exposure unit and temporarily adhering the substrate material to the bottom glass, preferably wherein the substrate material is coated with an adhesive layer on one side of the substrate material such that the adhesive coating is situated on the side of the substrate material furthest from the bottom glass;
  d) casting photopolymer resin onto the substrate material and laminating a flexible polyester sheet on top of the photopolymer resin, preferably wherein the flexible polyester sheet is coated on one side with a later of adhesive such that the adhesive coating is situated on the side of the flexible polyester sheet adjacent to the photopolymer resin; and
  e) exposing the photopolymer resin through the image film to selectively crosslink and cure the photopolymer resin and form a cured relief image or mold, wherein the depth of the cured relief image or mold is less than the height of the cast photopolymer resin.

BRIEF DESCRIPTION OF THE DRAWINGS

The present invention will be more fully understood when read in conjunction with the following drawings, in which.

Identically numbered elements in the various figures are intended to designate like elements.

DETAILED DESCRIPTION OF THE PREFERRED EMBODIMENTS

The present invention relates generally to a method of producing a photocured relief image element comprising a photopolymerizable resin which relief image element can be used for flexographic printing plates, for casting molds, particularly for use with bronze, and for sign boards such as display panels, decorative shields, name plates, Braille boards and the like.

Figure 1:
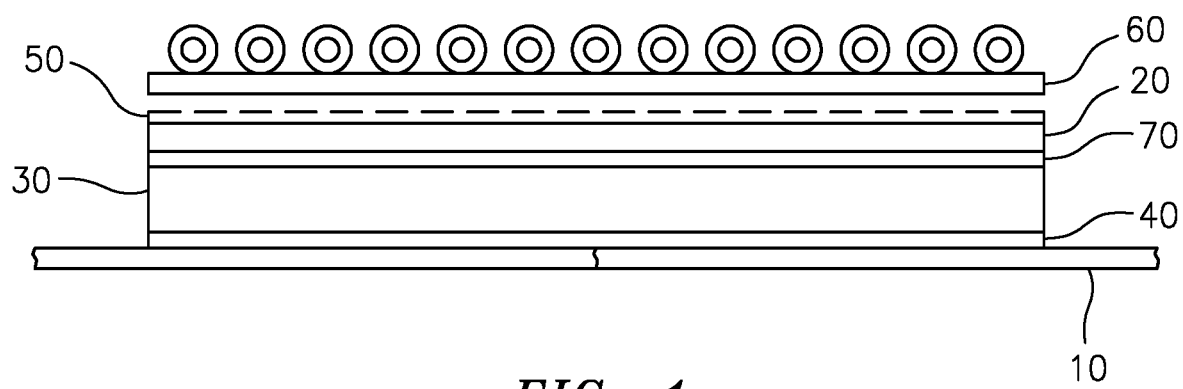
FIG. 1 depicts a printing plate manufacturing process in accordance with the present invention.

In particular, and as shown in FIG. 1, the present invention relates to a method of producing a relief image or mold from a liquid photopolymer resin, said method comprising the steps of:
  a) placing an image film 50 onto an exposure glass 60 of an exposure unit;
  b) placing a coverfilm 20 onto the image film 50 and applying a vacuum between the coverfilm 20 and the exposure glass 60 to tightly pull the coverfilm 20 and the image film 50 onto the exposure glass 60;
  c) placing a sheet of substrate material 40 onto a bottom glass 10 of the exposure unit and temporarily adhering the substrate material 40 to the bottom glass 10, preferably wherein the substrate material 40 is coated with an adhesive layer (not shown) on one side of the substrate material 40 such that the adhesive coating is situated on the side of the substrate material 40 furthest from the bottom glass;

d) casting photopolymer resin onto the substrate material 40 and laminating a flexible polyester sheet 70 on top of the photopolymer resin 30, preferably wherein the flexible polyester sheet 70 is coated on one side with a layer of adhesive (not shown) such that the adhesive coating is situated on the side of the flexible polyester sheet 70 adjacent to the photopolymer resin; and e) exposing the photopolymer resin 30 through the image film 50 to selectively crosslink and cure the photopolymer resin 30 and form a cured relief image or mold, wherein the depth of the cured relief image or mold is less than the height of the cast photopolymer resin 30.

Figure 2:
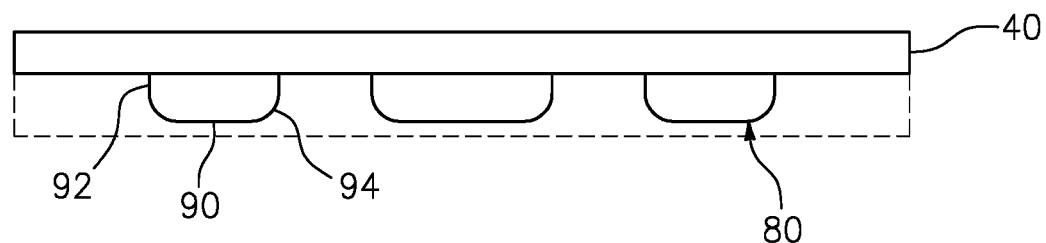
FIG. 2 depicts a partial cross-sectional schematic view of a printing plate produced by the process of the present invention.

The process described herein produces relief image patterns in which the relief pattern comprises rounded/smooth image edges. In other words, and as shown in FIG. 2, the relief pattern 80 produced does not have a sharp edge at the point where the top surface 90 of the raised relief pattern meets the sidewall 92 of the raised relief pattern but instead the edges 94 of the relief pattern 80 are smooth or rounded.

A liquid photopolymer resin 30 is cast on top of a bottom glass 10 that has been covered with a substrate material 40. The photopolymer resin 30 may be any material which is both fluid when uncured, and hardens upon exposure to selective wavelengths of actinic radiation. Such photopolymer resins are very commonly used in the photopolymer printing plate making industry, and thus are well known to those skilled in that art. One or more different photopolymer resins or resin compositions may be employed.

Any liquid photopolymer resin that is a fluid when uncured and that hardens upon exposure to selective wavelengths of actinic radiation may be used in the practice of the present invention. Examples of liquid curable photopolymer resins include those described above and in U.S. Pat. No. 3,794,494 to Kai et al., U.S. Pat. No. 3,960,572 to Ibata et al. and U.S. Pat. No. 4,442,302 to Pohl, the subject matter of each of which is herein incorporated by reference in its entirety.

Preferably, the coverfilm 20 that is placed over the image film 50 and the exposure glass 60 is either a biaxially oriented polypropylene (BOPP) film, a polyester film, or a polyethylene terephthalate (PET) film and is preferably transparent to actinic radiation. To aid in removal, the coverfilm 20 may be treated with a release agent such as a silicone release agent or other release agent known in the art. Also a vacuum is drawn on the coverfilm 20 in order to remove creases and hold it in place on the exposure glass 60.

Substantially simultaneously with casting the photopolymer resin layer 30 onto substrate material 40 which is adhered to bottom glass 10, a flexible polyester sheet 70 is laminated on the photopolymer resin layer 30. The substrate material 40 may preferably comprise a material selected from the group consisting of polyester films, acrylic films, acrylonitrile-butadiene-styrene resins, phenolic resins, and combinations of one or more of the foregoing, given by way of example rather than limitation. This substrate material 40 should be transparent or translucent to actinic radiation. If the substrate material diffracts the exposure radiation so as to impart the resolution of the image, collimated light may be used to overcome the diffraction. The substrate material 40 is preferably coated with a layer of adhesive on the side closest to the photopolymer layer 30 (ie. furthest from the bottom glass 10).

The flexible polyester sheet 70 is a polyester sheet which should be transparent or translucent to actinic radiation. The flexible polyester sheet is preferably coated with a layer of adhesive on the side closest to the photopolymer resin 30.

Thereafter, exposure to actinic radiation is then given through the exposure glass 60, image film 50, cover film 20, and flexible polyester sheet 70 to selectively crosslink and cure the liquid photopolymerizable resin layer.

In a preferred embodiment, exposure is limited so that less than the entire height of the liquid photopolymerizable resin is cured. The total thickness of the cast photopolymerizable resin layer 30 is about 10 to 50% higher than the height of the cured relief image 80. More preferably, the total thickness of the cast photopolymerizable resin layer 30 is about 25% higher than the height of the cured relief image 80.

In addition, the total thickness of the cast photopolymerizable resin layer 30 is typically between about 100 and about 200 mils, more preferably between about 125 and about 175 mils. The height of the resulting cured relief image 80 is typically between about 75 and about 175 mils, more preferably between about 100 and about 150 mils. For example, a suitable relief image 80 may be produced from a resin that is cast as a layer of about 150 to about 200 mils thick resin and "undercured" such that the resulting cured relief image 80 is about 125 mils in thickness.

The resulting relief image 80 has rounded/smooth edges 94 at the point where the top surface 90 of the raised pattern meets the sidewall 92 of the raised pattern as can be seen in FIG. 2. The process requires that the imagewise exposure not penetrate through the full thickness of the cast liquid photopolymerizable layer 30 with enough intensity to cure the photopolymer resin through its entire thickness. The deliberate under-exposure of the photopolymerizable resin layer 30 described herein has surprisingly been found to prevent the cured resin from exhibiting the flat and/or sharp edges that are present when the entire height of the liquid photopolymer resin layer is cured. By curing in this manner, a curve is built into the image.

Once the exposure step is complete, additional process steps may be performed as is generally well known to those skilled in the art. These additional steps may include reclaiming uncured liquid photopolymer from the surface of the photopolymerizable element, developing the relief image, post-exposing the relief image, detacking the relief image, and drying and light finishing the relief image, by way of example and not limitation as is well known in the art.

Various methods may be used to develop the relief layer. For example, uncured photopolymerizable resin can be washed away, can be blown away using an air knife, or can be blotted away or squeegeed away. A combination of two or more of the above-mentioned methods can be used. Preferably, the uncured photopolymerizable resin will be washed, emulsified or dissolved away using one of the commercial developer units available.

The specific developer solution used will depend upon the specific composition of the photopolymerizable resin used, and would generally be well known to those skilled in the art. Generally, an aqueous alkaline solution is used. In addition, it may also be desirable to employ a small amount of detergent or surface active agent in the developing solution.

Following development, the photopolymerizable resin layer may be "post-exposed" to actinic radiation, i.e., subjected to a second actinic radiation exposure, which may be of the same or different quality and quantity as the first actinic radiation exposure. Subjecting the plate to a second actinic radiation exposure may provide a more complete cure for the photopolymerizable layer of the invention, and thus a more durable relief image.

Finally, if desired, the image may be dried by, for example, blowing hot air on the image or by using an infrared heater.

The method described herein can be used to produce a photocured relief image comprising features selected from the group consisting of text, characters, Braille dots, lines, other images and combinations of one or more the foregoing. In another embodiment, the method described herein can be used to produce a photocured signboard, which can be used as a display panel, decorative shield, name plate, Braille board, or the like.

The same process described here can be used to form molds. Once the cured relief image is formed, a casting material may be applied to the mold corresponding to the desired relief image to form a cast article. As discussed above, the casting material is typically selected from the group consisting of plaster, resins, and low melting temperature metal alloys.

If a higher temperature metal alloy or other higher temperature molding material is to be cast into the mold produced as discussed above, it may be necessary to create an intermediate "female" mold by packing a mold making material, which as discussed above, may comprise sand and wax, into the mold to replicate a complementary relief pattern; and removing the mold, wherein a female mold results which may then be used for casting a metal or other high temperature molded article. Thereafter a metal article or other high temperature article can be made by casting a casting metal or other high temperature molding material into the female mold. The casting metal is selected from the group consisting of molten bronze, silver, aluminum, gold, platinum, copper and combinations of one or more of the foregoing. In one embodiment, the casting metal is molten bronze.

While the invention has been described above with reference to specific embodiments thereof, it is apparent that many changes, modifications, and variations can be made without departing from the inventive concept disclosed here. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A method of producing a relief image or mold from a liquid photopolymer resin, said method consisting essentially of the steps of:
   a) placing an image film over a surface of an exposure glass of an exposure unit;
   b) placing a cover film onto the image film and applying a vacuum between the cover film and the exposure glass to tightly pull the cover film and the image film onto the surface of the exposure glass;
   c) placing a substrate onto a second glass of the exposure unit and temporarily adhering the substrate to the second glass, wherein the substrate is coated with an adhesive layer on one side of the substrate such that the adhesive coating is situated on the side of the substrate furthest from the second glass;
   d) casting photopolymer resin onto the substrate material and laminating a flexible polyester sheet on top of the photopolymer resin, wherein the flexible polyester sheet is coated on one side with a layer of adhesive such that the layer of adhesive is situated on the side of the flexible polyester sheet adjacent to the photopolymer resin; and
   e) exposing the photopolymer resin through the image film to selectively crosslink and cure the photopolymer resin and form a cured relief image or mold, wherein the depth of the cured relief image or mold is less than the height of the cast photopolymer resin; and
   wherein the relief image comprises a raised relief pattern that has rounded edges at a point where a top surface of the raised relief pattern meets a sidewall of the raised relief pattern.

2. The method according to claim 1, further comprising the steps of reclaiming the uncured liquid photopolymerizable resin from the liquid photopolymerizable resin layer, developing the cured photopolymerizable resin layer, post-exposing the cured photopolymerizable resin layer, and drying the cured photopolymerizable resin layer after step e).

3. The method according to claim 1, wherein the cover film is selected from the group consisting of polyester, polyethylene terephthalate and biaxially oriented polypropylene.

4. The method according to claim 1, wherein the substrate comprises a material selected from the group consisting of polyester films, signage materials, acrylic films, acrylonitrile-butadiene-styrene resins, phenolic resins, and combinations of one or more of the foregoing.

5. The method according to claim 1, wherein collimated light is used in the exposing of step e).

6. The method according to claim 1, wherein the total thickness of the cast photopolymerizable resin layer is about 10 to 50% higher than the height of the cured relief image.

7. The method according to claim 6, wherein the total thickness of the cast photopolymerizable resin layer is about 25% higher than the height of the cured relief image.

8. The method according to claim 1, wherein the total thickness of the cast photopolymerizable resin layer is between about 100 and about 200 mils.

9. The method according to claim 8, wherein the height of the cured relief image is between about 75 and about 175 mils.

10. A photocured relief image comprising features selected from the group consisting of text, characters, Braille dots, lines, other images and combinations of one or more of the foregoing prepared by the method of claim 1.

11. A photocured signboard prepared by the method of claim 1.

12. The method according to claim 1, wherein a mold is formed, the method further comprising the step of applying casting material to the mold corresponding to the relief image to form a cast article.

13. The method according to claim 12, wherein the casting material is selected from the group consisting of plaster, resins, and low melting temperature metal alloys.

14. The method according to claim 12, further comprising the steps of:
   a) packing a mold making material into the mold to replicate a complementary relief pattern; and
   b) removing the mold,
   wherein a female mold results for casting a metal article.

15. A metal article made by casting a casting metal into the female mold made by the method of claim 12.

16. The metal article according to claim 15, wherein said casting metal is selected from the group consisting of molten bronze, silver, aluminum, gold, platinum, copper and combinations of one or more of the foregoing.

* * * * *